(12) United States Patent
George et al.

(10) Patent No.: US 8,395,755 B2
(45) Date of Patent: Mar. 12, 2013

(54) LITHOGRAPHIC APPARATUS AND DEVICE MANUFACTURING METHOD

(75) Inventors: Richard Alexander George, Son en Breugel (NL); Cheng-Qun Gui, Best (NL); Pieter Willem Herman De Jager, Rotterdam (NL); Robbert Edgar Van Leeuwen, Eindhoven (NL); Jacobus Burghoorn, Haelen (NL)

(73) Assignee: ASML Netherlands B.V., Veldhoven (NL)

( * ) Notice: Subject to any disclaimer, the term of this patent is extended or adjusted under 35 U.S.C. 154(b) by 724 days.

(21) Appl. No.: 12/506,808

(22) Filed: Jul. 21, 2009

(65) Prior Publication Data

US 2009/0284720 A1 Nov. 19, 2009

Related U.S. Application Data

(60) Continuation of application No. 12/113,831, filed on May 1, 2008, now Pat. No. 7,576,834, which is a division of application No. 10/853,577, filed on May 26, 2004, now Pat. No. 7,385,675.

(30) Foreign Application Priority Data

May 30, 2003 (EP) .................................. 03253419

(51) Int. Cl.
| | |
|---|---|
| *G01B 11/00* | (2006.01) |
| *G01B 11/14* | (2006.01) |
| *G01N 21/86* | (2006.01) |
| *G03B 27/32* | (2006.01) |
| *G03B 27/42* | (2006.01) |
| *G03B 27/54* | (2006.01) |
| *G03B 27/74* | (2006.01) |

(52) U.S. Cl. .............. 355/68; 250/548; 355/53; 355/67; 355/77; 356/400; 356/401; 356/615

(58) Field of Classification Search .... 250/201.1–201.2, 250/492.2, 548; 355/53, 55, 67–68; 356/399–401, 356/614–624; 430/30, 311–313
See application file for complete search history.

(56) References Cited

U.S. PATENT DOCUMENTS

| | | | |
|---|---|---|---|
| 4,778,275 A | 10/1988 | van den Brink et al. |
| 5,229,872 A | 7/1993 | Mumola |
| 5,247,329 A | 9/1993 | Oshida et al. |
| 5,296,891 A | 3/1994 | Vogt et al. |
| 5,448,332 A | 9/1995 | Sakakibara et al. |
| 5,486,851 A | 1/1996 | Gehner et al. |

(Continued)

FOREIGN PATENT DOCUMENTS

| | | |
|---|---|---|
| EP | 0 823 977 B1 | 1/2002 |
| EP | 1 482 375 A2 | 12/2004 |

(Continued)

OTHER PUBLICATIONS

European Search Report for European Appln. 03253419.0 mailed Apr. 13, 2004.

English language translation of Japanese Office Action, mailed Jul. 17, 2007, for JP Patent Application No. 2004-158545, 5 pgs.

(Continued)

*Primary Examiner* — Toan Ton
*Assistant Examiner* — Christine Riddle
(74) *Attorney, Agent, or Firm* — Sterne, Kessler, Goldstein & Fox P.L.L.C.

(57) ABSTRACT

A lithography apparatus includes a projection system configured to project a radiation beam onto a substrate, a detector configured to inspect the substrate, and a substrate table configured to support the substrate and move the substrate relative to the projection system and the detector. The detector is arranged to inspect a portion of the substrate while the substrate is moved and before the portion is exposed to the radiation beam.

16 Claims, 4 Drawing Sheets

U.S. PATENT DOCUMENTS

| | | | |
|---|---|---|---|
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,625,436 | A | 4/1997 | Yanagihara et al. |
| 5,657,130 | A | 8/1997 | Shirasu et al. |
| 5,677,703 | A | 10/1997 | Bhuva et al. |
| 5,808,797 | A | 9/1998 | Bloom et al. |
| 5,859,707 | A | 1/1999 | Nakagawa et al. |
| 5,912,726 | A | 6/1999 | Toguchi et al. |
| 5,982,553 | A | 11/1999 | Bloom et al. |
| 6,087,053 | A | 7/2000 | Hara |
| 6,133,986 | A | 10/2000 | Johnson |
| 6,177,980 | B1 | 1/2001 | Johnson |
| 6,304,316 | B1 | 10/2001 | Jain et al. |
| 6,312,134 | B1 | 11/2001 | Jain et al. |
| 6,341,011 | B1 | 1/2002 | Nara |
| 6,379,867 | B1 | 4/2002 | Mei et al. |
| RE37,762 | E | 6/2002 | Miyazaki et al. |
| 6,406,820 | B1 | 6/2002 | Ota |
| 6,473,237 | B2 | 10/2002 | Mei |
| 6,509,955 | B2 | 1/2003 | Mei et al. |
| 6,515,734 | B1* | 2/2003 | Yamada et al. ............. 355/54 |
| 6,611,382 | B2 | 8/2003 | Hashimoto |
| 6,650,354 | B2 | 11/2003 | Morizono et al. |
| 6,687,041 | B1 | 2/2004 | Sandstrom |
| 6,747,783 | B1 | 6/2004 | Sandstrom |
| 6,778,257 | B2 | 8/2004 | Bleeker et al. |
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 6,859,223 | B2 | 2/2005 | Shirota et al. |
| 6,886,154 | B2 | 4/2005 | Okuyama |
| 6,900,888 | B2 | 5/2005 | Yoshida et al. |
| 6,924,883 | B2 | 8/2005 | Ozaki et al. |
| 7,057,706 | B2 | 6/2006 | Ozaki et al. |
| 7,385,675 | B2 | 6/2008 | George et al. |
| 7,576,834 | B2 | 8/2009 | George et al. |
| 2001/0045690 | A1 | 11/2001 | Brandinger |
| 2002/0024714 | A1 | 2/2002 | Sandstrom et al. |
| 2003/0210383 | A1* | 11/2003 | Bjorklund et al. ............. 355/53 |
| 2004/0041104 | A1 | 3/2004 | Liebregts et al. |
| 2004/0130561 | A1 | 7/2004 | Jain |
| 2007/0296936 | A1 | 12/2007 | Kato et al. |

FOREIGN PATENT DOCUMENTS

| | | |
|---|---|---|
| EP | 1 517 188 A2 | 3/2005 |
| JP | 62-021220 A | 1/1987 |
| JP | 06-260391 A | 9/1994 |
| JP | 06-283403 A | 10/1994 |
| JP | 06-302498 A | 10/1994 |
| JP | 6-510632 A | 11/1994 |
| JP | 7-183212 A | 7/1995 |
| JP | 7-183214 A | 7/1995 |
| JP | 9-223651 A | 8/1997 |
| JP | 9-246139 A | 9/1997 |
| JP | 10-092717 A | 4/1998 |
| JP | 11-45851 A | 2/1999 |
| JP | 2000-122303 A | 4/2000 |
| JP | 2001-175002 A | 6/2001 |
| JP | 2002-190438 A | 7/2002 |
| JP | 2002-367900 A | 12/2002 |
| JP | 2003-050469 A | 2/2003 |
| JP | 2003-100626 A | 4/2003 |
| JP | 2004-163814 A | 6/2004 |
| JP | 2004-363590 A | 12/2004 |
| WO | WO 97/34171 A2 | 9/1997 |
| WO | WO 98/33096 A1 | 7/1998 |
| WO | WO 98/38597 A2 | 9/1998 |
| WO | WO 98/38597 A3 | 9/1998 |
| WO | WO 00/42618 A1 | 7/2000 |
| WO | WO 02/073288 A1 | 9/2002 |
| WO | WO 2004/111701 A1 | 12/2004 |
| WO | WO 2005/047955 A1 | 5/2005 |

OTHER PUBLICATIONS

Search Report for European Application No. EP 06 25 1482, search completed on Sep. 11, 2007, 7pgs.
Translation of Office Action for Japanese Patent Application No. 2004-158545 drafted on Jan. 7, 2008, 4 pgs.
Search Report and Written Opinion for Singapore Application No. 200402962-5, mailed Jan. 18, 208, 8 pgs.
Translation of Office Action, dated Apr. 5, 2007, for KR Patent Application No. 10-2004-0038332, 3 pgs.
Supplementary Search Report for Singapore Application No. 200402962-5 mailed Oct. 31, 2008, 5 pgs.
First Non-Final Office Action mailed May 19, 2006 for U.S. Appl. No. 10/853,577, filed May 26, 2004, 7 pgs.
First Final Office Action mailed Oct. 26, 2006 for U.S. Appl. No. 10/853,577, filed May 26, 2004, 8 pgs.
Second Non-Final Office Action mailed May 15, 2007 for U.S. Appl. No. 10/853,577, filed May 26, 2004, 9 pgs.
Second Final Office Action mailed Nov. 1, 2007 for U.S. Appl. No. 10/853,577, filed May 26, 2004, 8 pgs.
Notice of Allowance mailed Mar. 21, 2008 for U.S. Appl. No. 10/853,577, filed May 26, 2004, 8 pgs.
Partial Search Report for European Application No. 04253203.6-2222/ 1482375 mailed Apr. 7, 2009, 4 pgs.
English Translation of JP 07-183214 A (dated Jul. 21, 1995). cited by other.
Search Report for European Application No. 04253203.6-2222/ 1482375 mailed Jun. 23, 2009, 5 pgs.
Non-Final Office Action mailed Nov. 4, 2008 for U.S. Appl. No. 12/113,831, 7 pgs.
First Notice of Allowance mailed Mar. 6, 2009 for U.S. Appl. No. 12/113,831, 6 pgs.
Second Notice of Allowance mailed Jun. 11, 2009 for U.S. Appl. No. 12/113,831, 8 pgs.
English language Abstract of Japanese Patent Publication No. 06-260391 A, published Sep. 16, 1994; 1 page.
English language Abstract of Japanese Patent Publication No. 06-283403 A, published Oct. 7, 1994; 1 page.
English language Abstract of Japanese Patent Publication No. 10-092717 A, published Apr. 10, 1998; 1 page.
English translation of Japanese Notification of Reasons for Refusal directed to related Japanese Patent Application No. 2010-273585, Japanese Patent Office, dated Mar. 15, 2011; 3 pages.
Notification of Reasons for Refusal mailed Sep. 14, 2010 for Japanese Patent Application No. 2008-298002, 4 pgs.
English Abstract of Japanese Publication No. 2001-500628T published Jan. 16, 2001, 1 pg.
English-Language Abstract for Japanese Patent Publication No. 62-021220 A, published Jan. 29, 1987; 1 page.
English-Language Abstract for Japanese Patent Publication No. 06-302498 A, published Oct. 28, 1994; 1 page.
English-Language Abstract for Japanese Patent Publication No. 2000-122303 A, published Apr. 28, 2000; 1 page.
English-Language Abstract for Japanese Patent Publication No. 2001-175002 A, published Jun. 29, 2001; 1 page.
English-Lanuage Abstract for Japanese Patent Publication No. 2002-190438 A, published Jul. 5, 2002; 1 page.
English-Language Abstract for Japanese Patent Publication No. 2003-050469 A, published Feb. 21, 2003; 1 page.
English-Language Abstract for Japanese Patent Publication No. 2003-100626 A, published Apr. 4, 2003; 2 pages.
English-Language Translation of Notification of Reason(s) for Refusal directed to related Japanese Patent Application No. 2010-273585, mailed Feb. 7, 2012, from the Japanese Patent Office; 4 pages.
Final Rejection mailed Jan. 30, 2007 for U.S. Appl. No. 10/853,577, filed May 26, 2004; 9 pages.
Notice of Allowance mailed Feb. 4, 2008 for U.S. Appl. No. 10/853,577, filed May 26, 2004; 8 pages.

\* cited by examiner

LITHOGRAPHIC APPARATUS AND DEVICE MANUFACTURING METHOD

CROSS-REFERENCE TO RELATED APPLICATIONS

This application is a continuation of U.S. Non-Provisional application Ser. No. 12/113,831, filed May 1, 2008, now U.S. Pat. No. 7,576,834, which is a divisional of U.S. Non-Provisional application Ser. No. 10/853,577, filed May 26, 2004, now U.S. Pat. No. 7,385,675, which are all incorporated herein in their entireties by reference.

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (resist). Instead of a mask, the patterning means may comprise an array of individually controllable elements that generate the circuit pattern on an impinging light beam.

In general, a single substrate will contain a network of adjacent target portions that are successively exposed. Lithographic apparatus include steppers, in which each target portion is irradiated by exposing an entire pattern onto the target portion in one pass, and scanners, in which each target portion is irradiated by scanning the pattern through the projection beam in a given direction (the "scanning"-direction), while synchronously scanning the substrate parallel or anti-parallel to this direction.

In order to manufacture devices using lithographic techniques, it is typically necessary to form the device from multiple layers. When producing such a device from multiple layers, as each layer is created it is aligned with the previous layers. It has therefore been known to provide alignment marks on a substrate. Before each layer is exposed on the substrate, it is transported to an alignment measuring area, where the alignment marks are detected, allowing a precise determination of the position of the substrate relative to the alignment sensors. By moving the substrate in a controlled manner to the exposure position, a positional correction can be applied to accurately produce the subsequent layer in the correct position on the substrate. Such a system can be used to ensure that the overlay errors are small in comparison to the critical feature size.

However, as the critical feature size continues to diminish, further improvements in the overlay accuracy are required. Furthermore, as the alignment requirements increase, the time taken to locate and inspect the alignment marks increases, reducing the throughput of the apparatus.

Therefore, what is needed is a method and an apparatus in which the overlay accuracy can be improved without significant loss of throughput of the apparatus.

BRIEF SUMMARY OF THE INVENTION

One embodiment of the present invention provides a lithographic apparatus. The lithography apparatus includes a projection system configured to project a radiation beam onto a substrate, a detector configured to inspect the substrate, and a substrate table configured to support the substrate and move the substrate relative to the projection system and the detector. The detector is arranged to inspect a portion of the substrate while the substrate is moved and before the portion is exposed to the radiation beam.

Another embodiment of the present invention provides a device manufacturing method. The method includes moving a substrate relative to a projection system and a detector, inspecting a portion of the substrate using the detector, exposing the portion of the substrate using the projection system while the exposure conditions are adjusted according to the inspection.

It will be appreciated that combinations of the configurations discussed above may also be used.

Further embodiments, features, and advantages of the present invention, as well as the structure and operation of the various embodiments of the present invention are described in detail below with reference to accompanying drawings.

BRIEF DESCRIPTION OF THE FIGURES

The accompanying drawings, which are incorporated herein and form a part of the specification, illustrate various embodiments of the present invention and, together with the description, further serve to explain the principles of the invention and to enable a person skilled in the pertinent art to make and use the invention.

In the Figures, corresponding reference symbols indicate corresponding parts

DETAILED DESCRIPTION OF THE PREFERRED EMBODIMENTS

Terminology

Figure 1:
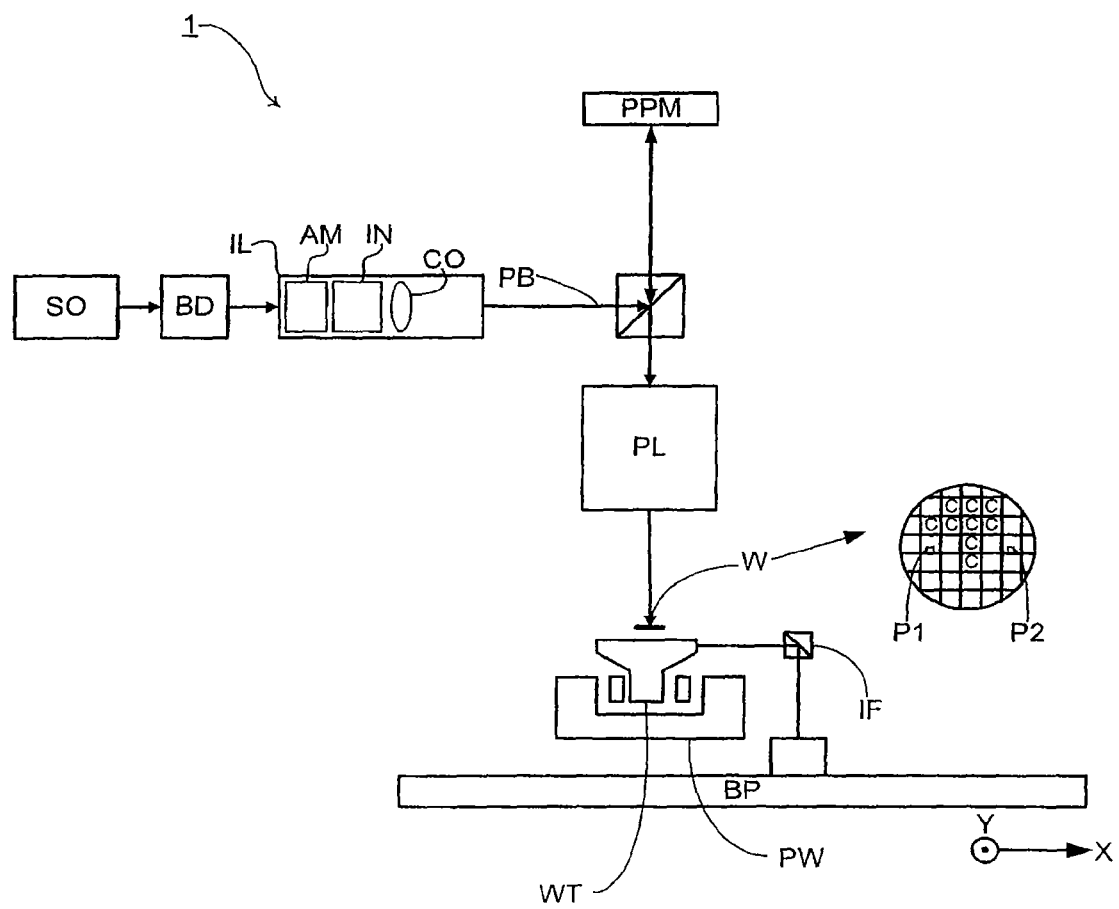
FIG. 1 depicts a lithographic apparatus.

The term "array of individually controllable elements" as here employed should be broadly interpreted as referring to any means that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning means include, but are not limited to, a programmable mirror array and a programmable liquid crystal device (LCD) array.

A programmable mirror array may comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate.

An array of diffractive optical MEMS devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors.

The matrix addressing can be performed using suitable electronic means. In the examples described above, the array of individually controllable elements can comprise one or more programmable mirror arrays. More information on mirror arrays can be found, for example, from U.S. Pat. Nos. 5,296,891 and 5,523,193, and PCT patent applications WO 98/38597 and WO 98/33096, which are incorporated herein by reference.

An example programmable LCD array is shown in U.S. Pat. No. 5,229,872, which is incorporated herein by reference.

It should be appreciated that where pre-biasing of features, optical proximity correction features, phase variation techniques, and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures, during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including, but not necessarily limited to, ultraviolet (UV) radiation (e.g. having a wavelength of 408, 355, 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the array of individually controllable elements and the first element of the projection system. Immersion techniques are well known in the art for increasing the numerical aperture of projection systems.

Exemplary Environment

FIG. 1 schematically depicts a lithographic projection apparatus, according to one embodiment of the invention. The apparatus comprises an illumination system (illuminator) IL, an array of individually controllable elements PPM, a substrate table WT for supporting a substrate W, and a projection system ("lens") PL.

Illumination system (illuminator) IL provides a projection beam PB of radiation (e.g. UV radiation).

The array of individually controllable elements PPM (e.g., a programmable mirror array) patterns the projection beam. In one example, the position of the array of individually controllable elements will be fixed relative to projection system PL. In another example, it may instead be connected to a positioning means for accurately positioning it with respect to projection system PL.

As discussed above, the substrate table WT (e.g., a wafer table) supports the substrate W (e.g. a resist-coated wafer). The substrate table WT is also connected to a positioning means PW for accurately positioning the substrate with respect to projection system PL.

The projection system ("lens") PL images a pattern imparted to the projection beam PB by the array of individually controllable elements PPM onto a target portion C (e.g., comprising one or more dies) of the substrate W. In one example, the projection system PL may image the array of individually controllable elements PPM onto the substrate W. In another example, the projection system PL may image secondary sources, for which the elements of the array of individually controllable elements PPM act as shutters. The projection system PL may also comprise an array of focusing elements, such as a micro lens array (known as an MLA) or a Fresnel lens array. This can be done, for example, to form the secondary sources and to image microspots onto the substrate.

In the embodiment shown, the apparatus is of a reflective type (i.e., has a reflective array of individually controllable elements). However, in general, it may also be of a transmissive type, e.g., with a transmissive array of individually controllable elements.

The illuminator IL receives a beam of radiation from a radiation source SO. In one example, the source SO and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD. In this case the beam delivery system BD includes, but is not limited to, suitable directing mirrors and/or a beam expander. In other examples the source SO may be integral part of the apparatus, for example when the source is a mercury lamp. In this example, the source SO and the illuminator IL, together with the beam delivery system BD, if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator IL can be adjusted. In some examples the illuminator IL comprises various other components, such as an integrator IN and a condenser CO. The illuminator IL provides a conditioned beam of radiation, referred to as the projection beam PB, having a desired uniformity and intensity distribution in its cross-section.

The beam PB subsequently interacts with the array of individually controllable elements PPM. Having been reflected by the array of individually controllable elements PPM, the beam PB passes through the projection system PL, which focuses the beam PB onto a target portion C of the substrate W.

In one example, with the aid of a positioning means PW, and possibly an interferometric measuring means IF, the substrate table WT can be moved accurately, e.g., so as to position different target portions C in the path of the beam PB.

In one example, a positioning means PW for the array of individually controllable elements PPM can be used to accurately correct the position of the array of individually controllable elements PPM with respect to the path of the beam PB, e.g. during a scan.

In one example, movement of the substrate table WT is realized with the aid of a long-stroke module (course positioning) and a short-stroke module (fine positioning), which are not explicitly depicted in FIG. 1. A similar system may also be used to position the array of individually controllable elements PPM.

It will be appreciated that the projection beam PB may alternatively/additionally be moveable while the substrate table WT and/or the array of individually controllable elements PPM may have a fixed position to provide the required relative movement.

As a further alternative, that may be especially applicable in the manufacture of flat panel displays, the position of the substrate table WT and the projection system PL may be fixed and the substrate W may be arranged to be moved relative to the substrate table WT. For example, the substrate table WT may be provided with a system for scanning the substrate W across it at a substantially constant velocity.

Although the lithography apparatus according to the invention is herein described as being for exposing a resist on a substrate, it will be appreciated that the invention is not limited to this use and the apparatus may be used to project a patterned projection beam for use in resistless lithography.

The depicted apparatus can be used in four preferred modes: a step mode, a scan mode, a pulse mode, and a continuous scan mode.

In a step mode, the array of individually controllable elements PPM imparts an entire pattern to the projection beam PB, which is projected onto a target portion C in one pass (i.e., a single static exposure). The substrate table WT is then shifted in the X and/or Y direction, so that a different target portion C can be exposed. In step mode, the maximum size of the exposure field limits the size of the target portion C imaged in a single static exposure.

In Scan mode, the array of individually controllable elements PPM is movable in a given direction (e.g., a "scan direction" or a Y direction) with a speed v, so that the projection beam PB is caused to scan over the array of individually controllable elements PPM. Concurrently, the substrate table WT is substantially simultaneously moved in the same or opposite direction at a speed V=Mv, in which M is the magnification of the lens PL. In scan mode, the maximum size of the exposure field limits the width (in the non-scanning direction) of the target portion C in a single dynamic exposure, whereas the length of the scanning motion determines the height (in the scanning direction) of the target portion C.

In Pulse mode, the array of individually controllable elements PPM is kept essentially stationary and the entire pattern is projected onto a target portion C of the substrate W using a pulsed radiation system. The substrate table WT is moved with an essentially constant speed, such that the projection beam PB is caused to scan a line across the substrate W. The pattern on the array of individually controllable elements PPM is updated as required between pulses of the radiation system. The pulses are timed such that successive target portions C are exposed at the required locations on the substrate W. Consequently, the projection beam PB scans across the substrate W to expose the complete pattern for a strip of the substrate W. The process is repeated until the complete substrate W has been exposed line by line.

Continuous scan mode is essentially the same as pulse mode except that a substantially constant radiation source is used and the pattern on the array of individually controllable elements PM is updated as the projection beam PB scans across the substrate W and exposes it.

Combinations and/or variations on the above described modes of use or entirely different modes of use may also be employed.

Exemplary Projection Optical Systems

Figure 2A:
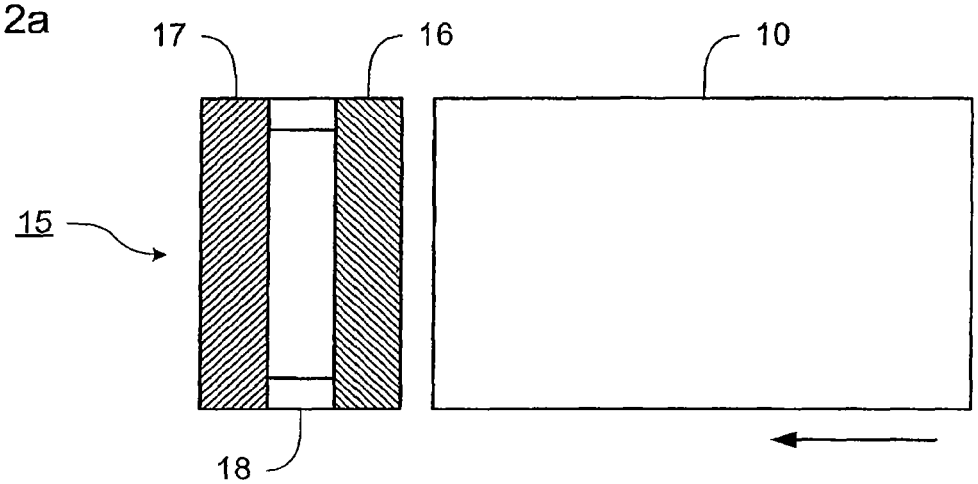
FIGS. 2a, 2b and 2c depict a substrate at three time instances as a layer on the substrate is being exposed.
Figure 2B:
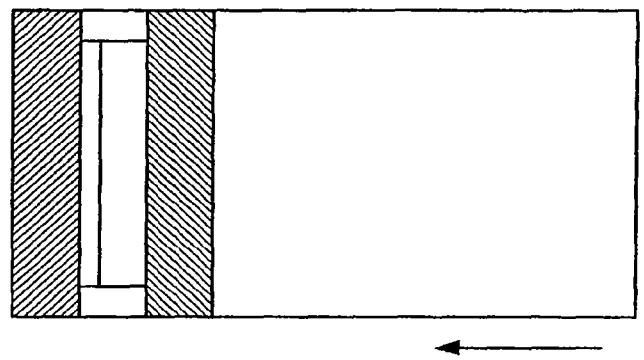
Figure 2C:
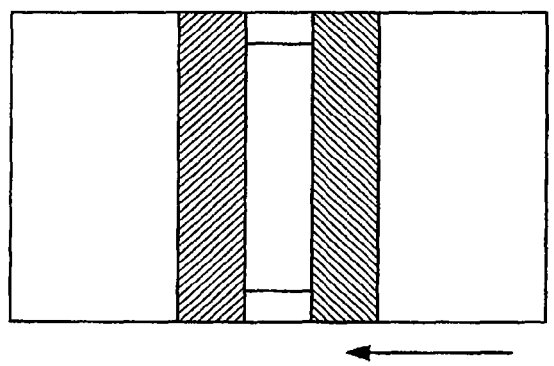

FIGS. 2a, 2b and 2c illustrate three states of a section of the apparatus, according to one embodiment of the present invention. In the section, an exposure and alignment module 15 is provided in a fixed location and a substrate 10 is scanned beneath exposure and alignment module 15. FIG. 2a depicts a first state, which is immediately before substrate 10 reaches exposure and alignment module 15. FIG. 2b depicts a second state, which is when substrate 10 begins to scan beneath exposure and alignment module 15. FIG. 2c depicts a third state, which is when substrate 10 continues to scan beneath exposure and alignment module 15.

In one example, exposure and alignment module 15 is comprised of a detector unit 16 and an exposure unit 17. Detector unit 16 and exposure unit 17 are connected by means of a reference frame 18, which ensures that the relative position of exposure unit 17 to detector unit 16 is fixed. Reference frame 18 may be formed from a material having very low thermal expansion to ensure that the relative positions are stable. The relative position can then be accurately determined by prior calibration.

As substrate 10 is scanned beneath exposure and alignment module 15, detector unit 16 inspects alignment marks (not shown) on substrate 10. The information from inspecting the alignment marks is used to accurately determine the position of substrate 10 in the scan direction, in the transverse direction (i.e., within the plane of substrate 10 and perpendicular to the scan direction), and perpendicular to substrate 10. Furthermore, the alignment marks may be used to ascertain the orientation of substrate 10 in all three degrees of rotational freedom. Detector unit 16 also inspects the alignment marks to determine the extent of any thermal expansion/contraction of substrate 10.

As substrate 10 scans beneath exposure and alignment unit 15, each part of substrate 10 passes first under detector unit 16 and then under exposure unit 17. Consequently, the linear position, orientation, and expansion information, determined by detector unit 16, for each portion of substrate 10 can be transferred to exposure unit 17 so that the exposure conditions for that portion of substrate 10 can be optimized when it is exposed as it passes underneath exposure unit 17.

In particular, the position of the pattern projected onto the portion of substrate 10 can be adjusted for errors in the position of the portion of substrate 10 in the scan and transverse directions. The best focus image plane can be adjusted for errors in the position of that portion of substrate 10 in the direction perpendicular to the plane of substrate 10. Magnification corrections can be made to correct for any thermal expansion/contraction of that portion of substrate 10.

In an example when the apparatus is used for the manufacture of flat panel displays, detector unit 16 may be positioned 30 cm in advance of exposure unit 17 (from the point of view of the advancing substrate). The scan speed of substrate 10 relative to detector unit 16 and exposure unit 17 may be 50 mm per second. Consequently the apparatus has 6 seconds in between inspecting a portion of substrate 10 using detector unit 16 and illuminating the same portion with exposure unit 17. This is sufficient time for the data from detector unit 16 to be used to adjust the exposure settings, as required, in the exposure unit.

The alignment marks on each portion of substrate 10 are inspected, allowing continuous corrections to be made. Consequently, overlay errors can be reduced even when there is local deformation of substrate 10.

A time difference between inspecting the alignment marks and substrate 10 and exposing the pattern on that part of substrate 10 is only limited by the separation of detector unit 16 and exposure unit 17 and the scanning speed of substrate 10. This is in contrast to presently known apparatus in which the substrate is first scanned in its entirety for alignment marks and then scanned in its entirety to expose the pattern. This results in a large time difference between a given portion of the substrate being inspected for alignment marks and that portion being exposed. During this time, additional deformations may be introduced which will result in overlay errors. For example, as the substrate is exposed, the radiation projected onto the substrate increases its temperature. This temperature increase results in a thermal expansion of the substrate. In known systems, this thermal expansion during exposure cannot be accounted for by inspecting alignment marks in a process that is separate from the exposure. In the present invention, however, this expansion is accounted for since the alignment marks are inspected as the exposure takes place. It is especially important for flat-panel display lithography which may be used to image soda-lime glass plates up to two meters long. For such a plate, the expansion would be approximately 8 μm per 1° C. temperature change. Therefore, to provide a required overlay accuracy of 0.35 μm without inspecting alignment marks during exposure, the temperature of substrate 10 would need to be controlled to ±0.05° C. over the entire plate. This would require complicated thermal control.

Furthermore, since the present invention does not require a separate process for inspecting the alignment marks on substrate 10, the processing time for each substrate is greatly reduced.

In various examples, the alignment marks on substrate 10 may be: alignment gratings parallel to both the scan direction and the transverse direction, chevron alignment marks, or image recognition via TV imaging. In another example, a sequence of alignment marks may be arranged in one or more rows parallel to the direction in which substrate 10 is scanned relative to detector unit 16 and distributed over the length of substrate 10. In one example, at least two such rows of alignment marks are provided on the substrate. In each case, known detection optic systems, appropriate for the alignment marks used, are provided in detector unit 16.

In one example, dedicated alignment marks are not provided on substrate 10. Instead, detector unit 16 is provided with one or more sensors (not shown) that can detect the pattern of the features that have been formed on substrate 10 in previous processing steps. Such sensors may be cameras connected to controllers that run pattern recognition algorithms. This arrangement can be beneficial because a dedicated alignment mark represents a portion of substrate 10 that cannot be used for a feature of the device being formed on substrate 10. Therefore, by using features of the formed device itself, a greater portion of substrate 10 can be used for functioning components of the formed device.

For example, this arrangement is used in the formation of flat panel displays. An alignment mark may be approximately the same size as a pixel of the display being formed. Therefore, if an alignment mark were required within the display, this would result in the absence of a pixel at that location in the formed device, which would clearly be unacceptable.

The use of features formed in a previous layer is also used for alignment. When a new layer is being formed on a device on a substrate 10, it is essential to ensure that it is correctly overlaid with the previous layers that have been formed on the device. By directly measuring the position of the features of the earlier layers formed on substrate 10, one can ensure that the next layer is correctly overlaid.

If, as described, detector unit 16 inspects functional features of the device being formed instead of dedicated alignment marks, it may be necessary around the edges of the device being formed to include dummy features (i.e., those that appear similar to the functional features) in order to ensure that the alignment is correct when forming the functional features at the edge of the device.

Figure 6:
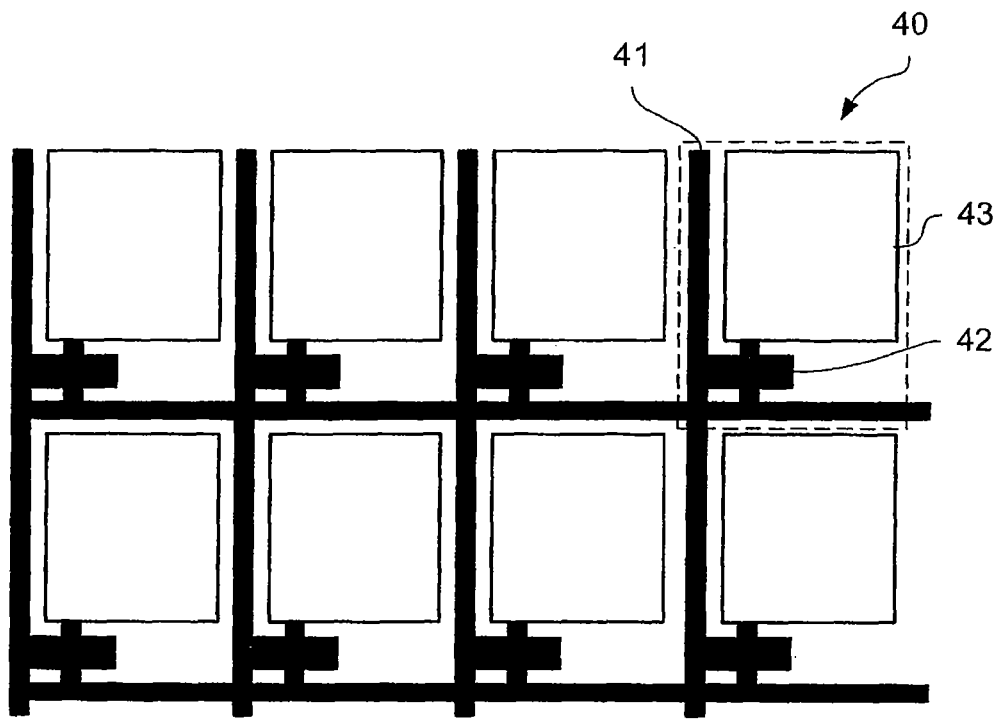
FIG. 6 depicts an example of an arrangement of repeating units of features formed on a substrate.

FIG. 6 schematically represents a portion of a feature pattern that may be formed on a substrate during the manufacture of a flat panel display, according to one embodiment of the present invention. An overall pattern is made up of a plurality of repeating units 40, comprising control lines 41, a thin film transistor 42, and a pixel 43.

In one example, an image recognition system may be used to identify repeating units 40 and accurately measure the position of the features. For example, a self-learning image recognition system may be used. As noted, the patterns are highly repeatable. Therefore, the image recognition detector may be used for the fine measurements of the position of the features on the substrate and a separate system may be used for coarse position measurement because there may be no distinguishable difference between the repeated units on different parts of the substrate.

In one example, a ruler may be provided on the substrate, namely a series of marks to indicate the position along the length of the substrate. The ruler may, for example, only be provided along the edge of the substrate because it is only being used for the coarse measurement of the position of the features of the device formed on the substrate. In other words, the ruler need not be formed at a position on the substrate where it would be desirable to form features of the device to be formed on the substrate.

Alternatively, or additionally, the image recognition sensor may be able to perform the coarse position measurement by storing information as the substrate scans relative to the detector unit. For example, the detector unit may count the number of repeating units 40 of the pattern of preceding layers formed on the substrate that have already scanned past the detector unit. This count data can therefore be used to determine which of the repeating units is subsequently identified by the pattern recognition detector.

With reference back to FIGS. 2a, 2b, and 2c, a position of the pattern that is projected onto substrate 10 may be moved by several means. Firstly, the position of substrate 10 may be corrected as it scans beneath exposure and alignment unit 15.

In one example, the substrate table may be mounted on a long-stroke module (not shown) that provides the scanning motion, while a short-stroke module (not shown) is mounted between the long-stroke module and the substrate table WT to provide the corrective movement.

In another example, exposure and alignment unit 15 or, at least, the exposure unit 17 (or a part thereof) may be mounted on an actuator (not shown) to provide corrective movements in order to project the pattern onto the correct portion of substrate 10.

In another example, the pattern formed on the array of individually controllable elements PPM is moved electronically. For example, the data provided to the array of individually controllable elements PPM is adjusted, such that the pattern appears shifted on the array of individually controllable elements PPM. In this case, the position of the pattern projected onto substrate 10 in a direction parallel to the scanning direction can also be adjusted by controlling the timing of the exposure of the pattern as substrate 10 is scanned beneath exposure unit 17 or adjusting the timing of a pattern being set on the array of individually controllable elements PPM if, for example, the apparatus is used in a continuous scan mode. Of course, a combination of the above-described techniques may also be used.

Exemplary Exposure Unit

Figure 3:
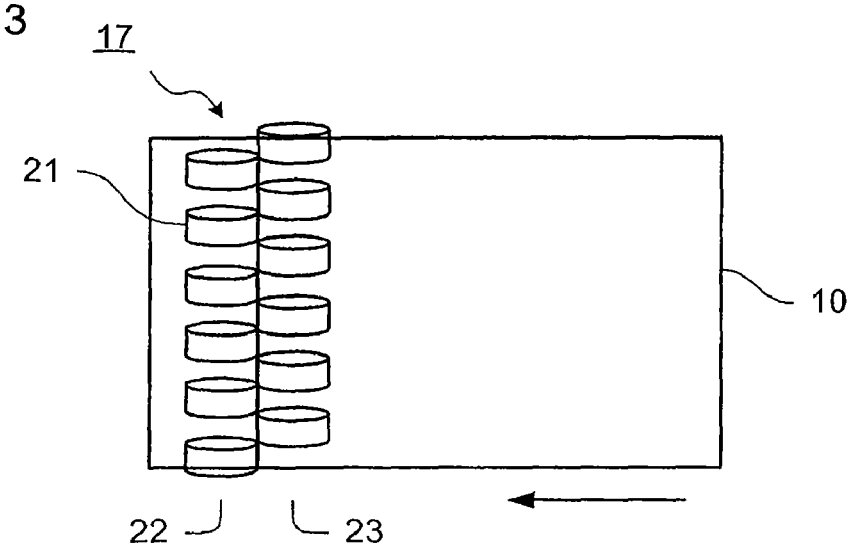
FIG. 3 depicts an arrangement of an exposure unit used in the lithographic apparatus.

FIG. 3 depicts an exposure unit 17, according to one embodiment of the present invention. Exposure unit 17 is comprised of a plurality of light engines 21 that are each capable of producing a patterned beam of radiation and projecting it onto substrate 10. Light engines 21 are arranged in first and second arrays 22, 23 perpendicular to the scan direction of substrate 10.

Figure 4:
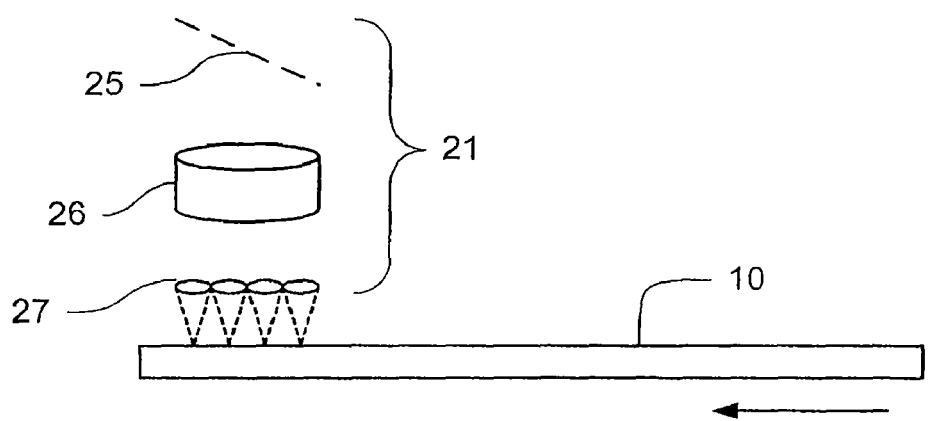
FIG. 4 depicts a part of an exposure unit as shown in FIG. 3.

FIG. 4 shows a light engine 21, according to one embodiment of the present invention. Each light engine 21 is comprised of an array of individually controllable elements 25, projection optics 26, and a micro-lens array 27 (MLA). In various examples, two or more light engines 21 may share a common radiation source or each may be provided with an independent radiation source. It will also be appreciated that the array of individually controllable elements 25 may be wholly imaged onto the substrate 10 without using an MLA.

Figure 5:
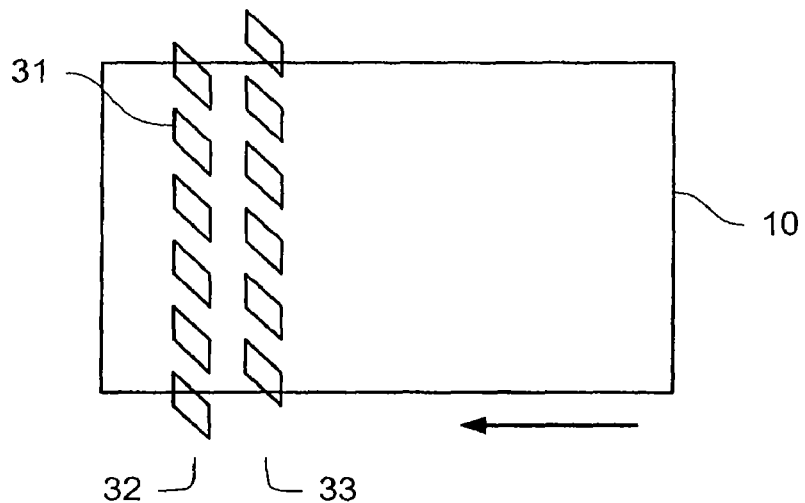
FIG. 5 depicts the exposure field produced by an exposure system as shown in FIG. 3.

FIG. 5 shows features formed on substrate 10, according to one embodiment of the present invention. In this embodiment, arrays 22, 23 of light engines 21 produce corresponding formed feature arrays 32, 33 of pattern images 31 on substrate 10. In each array 22, 23 of light engines 21, space is provided between each light engine 21. This space may be used to provide ancillary services for light engines 21, such as cooling, or to provide space for radiation sources. Consequently, there are gaps in arrays 32, 33 of patterned images 31 projected onto substrate 10. Arrays 22, 23 of light engines 21 are arranged such that second array 32 of patterned images 31 projected onto substrate 10 by second array of light engines 22 coincide with the gaps in the first array 33 of patterned images projected onto the substrate by first array 23 of light engines 21 after substrate 10 has moved a given distance. Consequently, a complete strip of substrate 10 across the transverse direction can be exposed notwithstanding the gap between light engines 21.

In FIGS. 3 and 5, there are two arrays of light engines 21. It will be appreciated, however, that additional arrays can be provided in exposure unit 17. This can be, for example, to allow for larger gaps between light engines 21 or to allow each part of substrate 10 to receive more than one exposure within a single scan.

In one example, each of the adjustments that are made to pattern 31 projected onto substrate 10 in response to information from detector unit 16 can be made independently by each of light engines 21. This may be effected by providing individual actuators to control the position of each light engine 21, by providing magnification control and best focus image plane control in the projection optics 26 and/or the micro lens arrays of each light engine 21 and/or by providing separate data control for each light engines 21, so that electronic corrections can be applied independently. By this means it is possible to compensate for local distortions and deformations across substrate 10. It may, however, be desirable to also provide global compensation means (i.e., compensation means that affect the pattern produced by all light engines 21) to compensate for, for example, positional errors of substrate 10 as a whole.

Where light engines 21 are not mounted on separate actuators, the micro-lens arrays 27 of all light engines 21 may be mounted on a single reference frame that, in one example, has a very low thermal expansion. However, if required, the position of each micro-lens array 27 relative to the reference frame may be adjustable. Similarly, the array of individually controllable elements PPM of all light engines 21 may be mounted on a separate reference frame and the position of each relative to the reference frame may be adjustable. Consequently, the relative positions of the patterns produced by light engines 21 can be measured and calibrated.

The magnification of each light engine 21 can be adjusted by changing the position of the array of individually controllable elements PPM to compensate for any expansion/contraction of substrate 10, or by any other suitable optical method. Alternatively or additionally, the magnification of the pattern projected onto substrate 10 can be adjusted by electronically changing the pattern applied to the array of individually controllable elements PPM. As before, this may be performed independently for each light engine 21 and/or globally for all light engines 21. For example, this can be done by adjusting the position of the reference frame on which all of the arrays of individually controllable elements are mounted. In one example, the magnification control range is about ±15 ppm.

In a variant of the above-described embodiment, detector unit 16 and exposure unit 17 may not be rigidly connected to one another or may be connected by a frame that is subject to thermal expansion/contraction. In this case, a position sensor must be provided to monitor the position of exposure unit 17 relative to detection unit 16. Thus the relative position remains known, even if it is not fixed.

Exemplary Detector Unit

Figure 7:
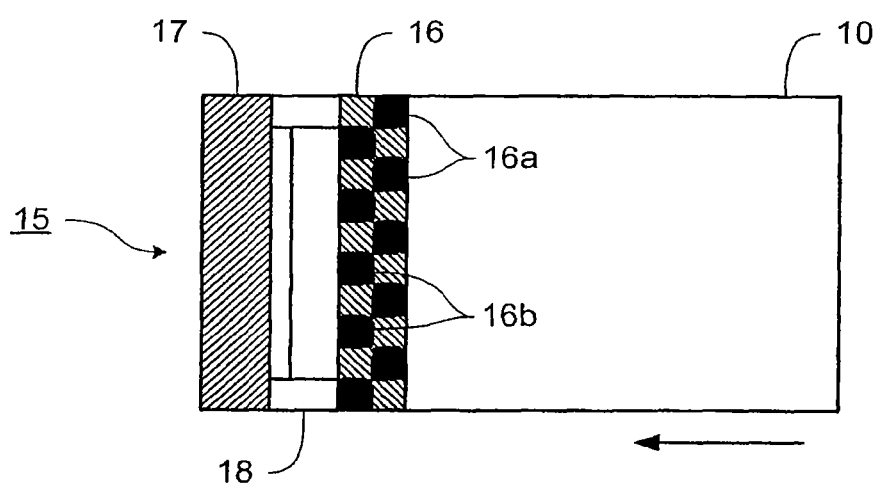
FIG. 7 depicts an arrangement of a detector unit used in a lithographic apparatus.

FIG. 7 shows detector unit 16, according to one embodiment of the present invention. In this embodiment, detector unit 16 comprises a plurality of sensors 16a,16b such that the alignment marks and/or features of previously formed layers on substrate 10 can be inspected across the full width of substrate 10. Consequently, variations across the width of substrate 10 in the deformation of substrate 10 and/or the alignment of features already formed on substrate 10 can be taken into account when setting the exposure conditions in exposure unit 17.

In this embodiment, sensors 16a,16b in detector unit 16 may be arranged in a manner corresponding to that of the light engines in exposure unit 17. For example, sensors 16a,16b may be arranged in a first array of sensors 16a and second array of sensors 16b, each array comprising a set of spaced apart sensors. Therefore, although the full width of substrate 10 is inspected, clearance can be provided around each sensor 16a,16b for control lines, services, etc.

It will be appreciated that in an arrangement as described above, each sensor 16a,16b may be arranged such that it is associated with a given light engine 21, namely each portion of the substrate that is inspected by a given sensor is subsequently exposed using the associated light engine. It will also be appreciated that this arrangement need not be limited to two rows of sensors 16a,16b as shown in FIG. 7 but may be configured with any number of rows, as convenient. In addition, detector unit 16 may be arranged such that it does not inspect each part of substrate 10. For example, a row of sensors may be arranged across the width of detection unit 16, but set apart from one another. In this case, the sensors are arranged to measure the position and/or orientation of the substrate and/or the features formed on the substrate at a plurality of locations that are set apart from one another. The exposure condition can therefore be set for these areas on the substrate directly from the measurements from the sensors. For the areas in between, which have not been inspected by sensors, the exposure conditions may be set by interpolating the data from two or more sensors that have inspected the surrounding portions of the substrate.

It is further to be appreciated that although the invention has been primarily described above in relation to an apparatus that uses the pulse mode (described above), in which substrate 10 is moved at an essentially constant speed and the exposures are pulsed, it will be appreciated that the invention may equally be applied to apparatus that operates in a stepped mode (described above) and apparatus that operates in a scan mode (described above).

Furthermore, although the invention refers to the use of an array of individually controllable elements PPM for patterning radiation beam PB, it will be appreciated that the invention may be equally applied to apparatus using a conventional fixed mask to pattern the projection beam PB. In this case, it may be used, for example, with an apparatus operating in scan mode. The detector could be located between the mask and the substrate and arranged to precede the patterned projection beam as it scans across the substrate.

Finally, although the invention has been described in terms of substrate 10 being moved below exposure and alignment unit 15, it will be readily appreciated that the absolute positions described are not essential to the invention, nor is it essential that a given part of the apparatus be fixed. It is only necessary that substrate 10 move relative to exposure and alignment unit 15.

While specific embodiments of the invention have been described above, it will be appreciated that the invention may be practiced otherwise than as described. The description is not intended to limit the invention.

What is claimed is:

1. A lithography apparatus comprising:
a projection system configured to project a radiation beam onto a substrate;
an alignment detector configured to inspect one or more patterned features on the substrate; and
a substrate table configured to support the substrate and move the substrate relative to the projection system and the alignment, detector;
wherein the alignment detector is further configured to inspect a full width of the substrate while the substrate is moved and before a portion of the full width is exposed to the radiation beam.

2. The apparatus of claim 1, wherein the alignment detector has a plurality of sensors configured to substantially simultaneously inspect the full width of the substrate.

3. The apparatus of claim 1, further comprising a controller configured to adjust exposure conditions based on the inspecting.

4. The apparatus of claim 1, wherein the apparatus is configured to provide a patterned beam using an array of individually controllable elements.

5. The apparatus of claim 4, wherein the apparatus comprises a plurality of arrays of individually controllable elements.

6. A device manufacturing method comprising:
moving a substrate relative to a projection system and an alignment detector;
inspecting one or more patterned features on the substrate using the alignment detector, wherein the inspecting occurs across a full width of the substrate; and
exposing a portion of the full width of the substrate using the projection system while one or more exposure conditions are adjusted according to the inspection.

7. The method of claim 6, wherein the inspecting and the exposing occur while moving the substrate.

8. The method of claim 6, wherein moving the substrate relative to the projection system and the alignment detector occurs between consecutive exposures.

9. The method of claim 6, wherein moving the substrate relative to the projection system and the alignment detector occurs during continuous exposure.

10. The method of claim 6, wherein a portion of the fall width of the substrate being inspected subsequently becomes the portion of the substrate being exposed.

11. The method of claim 6, wherein the exposure conditions are adjusted to optimize for overlay accuracy.

12. The method of claim 6, wherein the substrate moves at a substantially constant velocity relative to the projection system and the alignment detector.

13. The method of claim 6, wherein the position of the alignment detector relative to the projection system is substantially fixed and known.

14. The method of claim 6, further comprising monitoring the position of the alignment detector relative to the projection system during exposure.

15. The apparatus of claim 1, wherein the alignment detector is further configured to inspect one or more patterned features on the substrate while the alignment detector remains stationary.

16. The method of claim 6, wherein the inspecting further comprises inspecting one or more patterned features while the alignment detector remains stationary.

* * * * *

UNITED STATES PATENT AND TRADEMARK OFFICE
CERTIFICATE OF CORRECTION

PATENT NO. : 8,395,755 B2  
APPLICATION NO. : 12/506808  
DATED : March 12, 2013  
INVENTOR(S) : George et al.

It is certified that error appears in the above-identified patent and that said Letters Patent is hereby corrected as shown below:

Title page, (75) Inventors section, after "Pieter Willem Herman" please delete "De", and insert --de--.

Title Page 2, Under "OTHER PUBLICATIONS", after "Search Report and Written Opinion for Singapore Application No. 200402962-5, mailed Jan. 18," please delete "208" and insert --2008--.

In the Claims:

Column 12, Claim 10, line 57, after "of the" please delete "fall" and insert --full--.

Signed and Sealed this  
Fourth Day of June, 2013

Teresa Stanek Rea  
*Acting Director of the United States Patent and Trademark Office*